United States Patent [19]

Ikada

[11] Patent Number: 5,966,060
[45] Date of Patent: Oct. 12, 1999

[54] SURFACE ACOUSTIC WAVE APPARATUS HAVING AN INTERDIGITAL TRANSDUCER GROUND ELECTRODE CONNECTED TO MULTIPLE PACKAGE GROUNDS

[75] Inventor: Katsuhiro Ikada, Kanazawa, Japan

[73] Assignee: Murata Manufacturing Co., Ltd., Kyoto, Japan

[21] Appl. No.: 08/931,566

[22] Filed: Sep. 16, 1997

[30] Foreign Application Priority Data

Sep. 17, 1996 [JP] Japan ................................. 8-245188

[51] Int. Cl.⁶ ........................................................ H03H 9/64
[52] U.S. Cl. ...................... 333/193; 333/194; 310/313 D; 310/313 B
[58] Field of Search ................................... 333/193–196; 310/313 R, 313 B, 313 C, 313 D

[56] References Cited

U.S. PATENT DOCUMENTS 5,561,406  10/1996  Ikata et al. ............................ 333/193 X
5,585,684  12/1996  Abe ....................................... 310/313 A

FOREIGN PATENT DOCUMENTS

3-284006  12/1991  Japan .................................. 333/193
5-55872    3/1993  Japan .................................. 333/193
6-152313    5/1994  Japan .................................. 333/193
6-164309    6/1994  Japan .................................. 333/193
8-265092  10/1996  Japan .................................. 333/193

*Primary Examiner*—Benny T. Lee
*Assistant Examiner*—Barbara Summons
*Attorney, Agent, or Firm*—Graham & James LLP

[57] ABSTRACT

A surface acoustic wave apparatus includes first and second longitudinally-coupled resonator filters disposed on a surface-wave board. In each longitudinally-coupled resonator filter, the ground electrodes of IDTs disposed at opposite sides of the center IDT and adjacent to reflectors are connected to different ground electrodes located on the same layer in the package, with at least two bonding wires.

20 Claims, 11 Drawing Sheets

SURFACE ACOUSTIC WAVE APPARATUS HAVING AN INTERDIGITAL TRANSDUCER GROUND ELECTRODE CONNECTED TO MULTIPLE PACKAGE GROUNDS

BACKGROUND OF THE INVENTION

1. Field of the Invention

The present invention relates to a surface acoustic wave (SAW) apparatus, and more particularly, to a surface acoustic wave apparatus in which a SAW chip is accommodated into a package including a multilayer board.

2. Description of the Related Art

In a conventional surface acoustic wave apparatus, a metallic, hermetically sealed case has been used as a packaging member for accommodating a SAW chip. Since a lead terminal extends from the hermetically sealed case, however, the apparatus cannot be surface-mounted.

To allow surface-mounting, a surface acoustic wave apparatus using a multilayer board as a part of its packaging member has been proposed (for example, in Japanese Unexamined Patent Publication No. 4-263509).

In a conventional SAW apparatus in which a SAW filter chip is accommodated into a package, the ground electrodes of input and output inter-digital transducers (IDTs) are connected in common to the ground electrode of the package member in order to simplify a wiring process.

With such a structure, however, sufficient attenuation cannot be obtained at the outside of the pass band. The reason for such a disadvantage will be described below by referring to FIG. 1.

Figure 1:
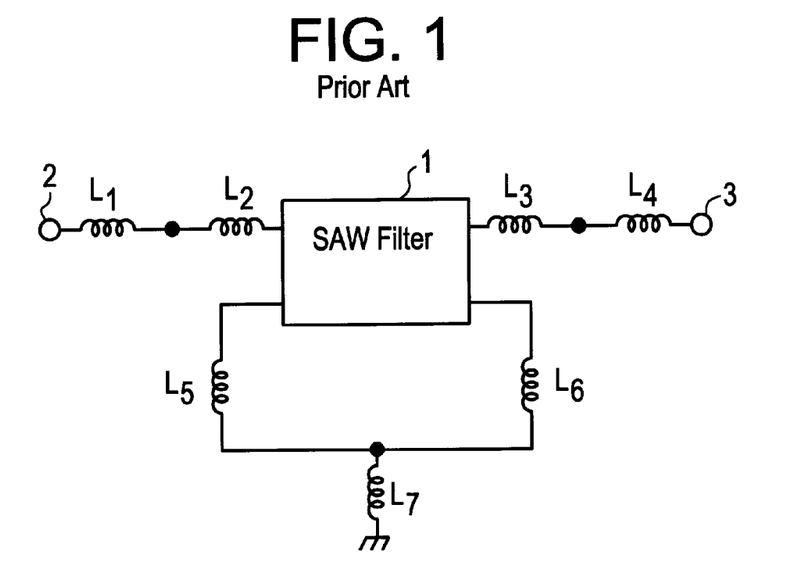
FIG. 1 is an equivalent circuit diagram of a conventional surface acoustic wave apparatus used for describing the effects of residual inductances created by bonding wires and the ground electrodes of a package member.

FIG. 1 illustrates an equivalent circuit of a conventional surface acoustic wave apparatus used for describing the effects of inductances created by bonding wires and the ground electrode of the package member. A SAW filter chip 1 is connected between an input end 2 and an output end 3. Between the input end 2 and the SAW filter chip 1, there exists an inductance $L_1$ created by the input electrode made on the package member and an inductance $L_2$ created by the bonding wire connected between the input electrode of the package member and the hot-side electrode of the input IDT of the SAW filter chip 1. On the other hand, between the SAW filter chip 1 and the output end 3, there exists an inductance $L_3$ created by the bonding wire connected between the hot-side electrode of the output IDT of the SAW filter chip 1 and the output electrode disposed on the package member and an inductance $L_4$ created by the output electrode.

The ground electrodes of the input IDT and the output IDT are connected in common to the same ground pattern of the package member in order to reduce the number of terminals to be mounted and to facilitate a mounting process. In other words, the ground electrode of the input IDT of the SAW filter chip 1 is connected to the ground pattern of the package member with bonding wire. An inductance $L_5$ caused by this bonding wire is introduced between the ground electrode of the input IDT and the ground pattern of the package member. In the same way, an inductance $L_6$ is created by bonding wire between the ground electrode of the output IDT and the ground pattern of the package member. An inductance $L_7$ is created by the ground pattern of the package member.

In the above conventional surface acoustic wave apparatus, sufficiently large attenuation cannot be obtained outside the pass band due to the effects of the inductances $L_5$ and $L_6$, caused by the above bonding wires at the ground side, and the inductance $L_7$, created by the ground pattern of the package member.

Figure 2:
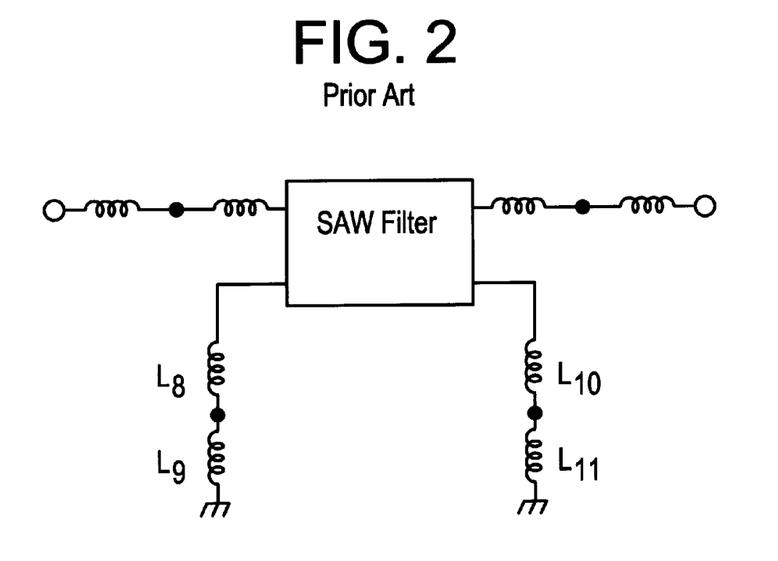
FIG. 2 is an equivalent circuit diagram of another conventional surface acoustic wave apparatus used for describing the effects of residual inductances created by bonding wires and the ground electrodes of a package member.

In the surface acoustic wave apparatus specified in Japanese Unexamined Patent Publication No. 4-263509, a SAW filter chip is accommodated into a package member using a multilayer board, and the ground electrode of the input IDT and the ground electrode of the output IDT in the SAW filter chip are connected to ground patterns located on different layers of the package member to increase attenuation outside the pass band. In other words, as shown in FIG. 2, the ground electrode of the input IDT and the ground electrode of the output IDT in the SAW filter chip are electrically connected to different ground electrodes located on different layers of the package member in the conventional surface acoustic wave apparatus.

An inductance $L_8$ created by the bonding wire and a residual inductance $L_9$ caused by a first ground electrode disposed in the package are introduced between the ground electrode of the input IDT and the ground. An inductance $L_{10}$ caused by the bonding wire and an inductance $L_{11}$ caused by a second ground electrode located in the package are introduced between the ground electrode of the output IDT and the ground.

As described above, it is noted in the Publication No. 4-263509 that the inductances to the ground are completely separated between the input side and the output side, and thereby a decrease in attenuation outside the pass band is avoided.

A surface acoustic wave apparatus has been provided with advanced functions recently. A surface acoustic wave apparatus is proposed, for example, in which a plurality of SAW filters having different pass-band characteristics are accommodated into one package. In such a structure, when the ground electrodes of the input and output sides of a plurality of SAW filters are individually connected to ground electrodes located in the package, the surface acoustic wave apparatus must be large and cannot have a reduced size.

To reduce the overall dimensions of an entire surface acoustic wave apparatus, very fine electrodes must be formed in order to independently connect the ground electrodes of the input and output sides of each SAW filter chip to ground electrodes located in the package. Thus, a connection process with bonding wire becomes very complicated. In addition, the cost increases significantly and a manufacturing yield is reduced.

As a SAW filter uses higher frequencies, it becomes difficult to suppress noise just by independently connecting the input ground electrodes and the output ground electrodes because of a large effect of residual inductance.

When a number of independent ground electrodes are disposed in a package member, paths for leading the case ground of the package to the outside are limited and sufficient case grounding may not be obtained. Thus, noise may become large in the surface acoustic wave apparatus.

SUMMARY OF THE INVENTION

Accordingly, the preferred embodiments of the present invention provide a compact, inexpensive surface acoustic wave apparatus in which the effects of residual inductance existing between the ground electrodes of a SAW chip and the ground electrodes of the package member are reduced to increase attenuation outside the pass band, and a decrease in attenuation outside the pass band is prevented especially at the higher-frequency side.

According to one preferred embodiment of the present invention, a surface acoustic wave apparatus includes a resonator filter chip including a surface-wave board; at least three interdigital transducers disposed on the surface-wave board; and a pair of reflectors located at opposite sides of an area where the at least three interdigital transducers are disposed, the surface acoustic wave apparatus being accommodated into a multilayer package having a plurality of ground electrodes, wherein the ground electrode of at least one of the interdigital transducers located adjacent to the reflectors is connected to at least two different ground electrodes disposed on the same layer of the package.

In a further preferred embodiment, the ground electrode of each of the two interdigital transducers located adjacent to the reflectors is connected to at least two different ground electrodes disposed on the same layer of the package.

In the surface acoustic wave apparatus according to the preferred embodiments of the present invention, the ground electrode of at least one of the IDTs located adjacent to the reflectors is connected to at least two different ground electrodes located on the same layer of the package preferably via at least two bonding wires. In other words, the surface acoustic wave apparatus is characterized in that the ground electrode of at least one of the input and output IDTs adjacent to the reflectors is connected to at least two different ground electrodes in the package via at least two bonding wires. As a result of this arrangement, ground paths extending from portions connected to the ground of the longitudinally-coupled resonator filter chip to package portions for connecting to the external ground are enhanced. The effects of residual inductance at the ground side are reduced, attenuation outside the pass band is increased, and a decrease in attenuation especially at the higher frequency side of the pass band is prevented.

In the surface acoustic wave apparatus, since the ground electrode of at least one of the IDTs located adjacent to the reflectors is connected to at least two different ground electrodes located on the same layer of the package, residual inductance at a portion extending from the ground edge of the SAW filter chip to a ground terminal of the package is reduced, and the ground paths extending from the package to an external terminal of the package are enhanced. Therefore, a decrease in attenuation at the higher frequency side of the pass band is prevented. Thus, a surface acoustic wave apparatus having superior frequency-amplitude characteristics is provided.

In the preferred embodiments of the present invention, at least two bonding wires are preferably connected to the ground electrodes of the IDTs adjacent to the reflectors. At least two bonding wires may be connected to the ground electrode of one of the IDTs. Alternatively, at least two bonding wires may include a first bonding wire connected to one of the IDTs adjacent to the reflectors and a second bonding wire connected to the ground electrode of the other IDT.

The surface acoustic wave apparatus according to the preferred embodiments of the present invention may be preferably configured such that a third bonding wire connected to the ground electrode of one of the IDTs adjacent to the reflectors is further provided in addition to the above at least two bonding wires, and one bonding wire of the at least two bonding wires is connected to a ground electrode of the package to which the third bonding wire is connected.

The ground electrode of the IDT to which the third bonding wire is connected and a ground electrode of the package to which the third bonding wire is connected are connected not only by the third bonding wire but also by the one bonding wire of the at least two bonding wires. As a result of this arrangement, ground paths located between the ground electrode of the IDT and a ground electrode of the package both of which are connected by the third bonding wire are enhanced. Therefore, a decrease in attenuation outside the pass band, especially at the higher frequency side, is effectively prevented.

The surface acoustic wave apparatus according to the preferred embodiments of the present invention may be preferably configured such that a fourth bonding wire connected to the ground electrode of the center interdigital transducer is further provided in addition to the above-described at least two bonding wires and the third bonding wire, provided as required, and one bonding wire of the at least two bonding wires is electrically connected to a ground electrode of the package to which the fourth bonding wire is connected.

Since the ground electrode of the center IDT is electrically connected to a ground electrode of the package by the fourth bonding wire, and one bonding wire of the at least two bonding wires is electrically connected to a ground electrode of the package to which the fourth bonding wire is connected, paths for leading the case ground of the package to the outside are further enhanced. Therefore, a decrease in attenuation outside the pass band, especially at the higher frequency side, is further effectively prevented.

The surface acoustic wave apparatus according to the preferred embodiments of the present invention may be configured such that two longitudinally-coupled resonator filters having different pass-band characteristics are provided, the inputs or the outputs of the two longitudinally-coupled resonator filters are connected in parallel, and each ground electrode is connected to an independent ground electrode located on the same layer of the package by bonding wire. The preferred embodiments of the present invention can also be applied to a two-stage surface acoustic wave apparatus in which two longitudinally-coupled resonator filters are connected. Thus, a pattern for leading the input and output grounds of such a surface acoustic wave apparatus to the outside is simplified. In addition, paths for a case ground are enhanced to suppress or eliminate a decrease in attenuation outside the pass band.

It is preferred in the surface acoustic wave apparatus having the two longitudinally-coupled resonator filter that a ground electrode disposed in the package be electrically connected to at least three external electrodes disposed on a surface of the package. As a result, the case ground is further reliably provided, and a decrease in attenuation at the higher frequency side of the pass band is effectively suppressed.

DETAILED DESCRIPTION OF PREFERRED EMBODIMENTS

Surface acoustic wave apparatuses according to preferred embodiments of the present invention will be described below by referring to the drawings.

Figure 3:
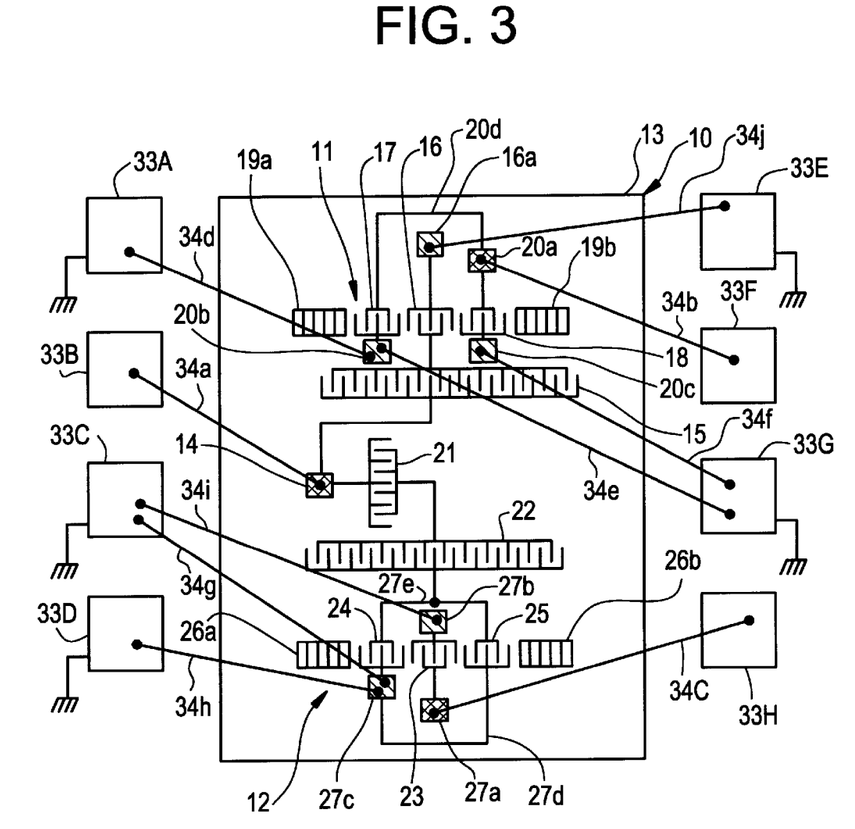
FIG. 3 is a rough plan view of a surface acoustic wave apparatus according to a first preferred embodiment of the present invention.
Figure 4:
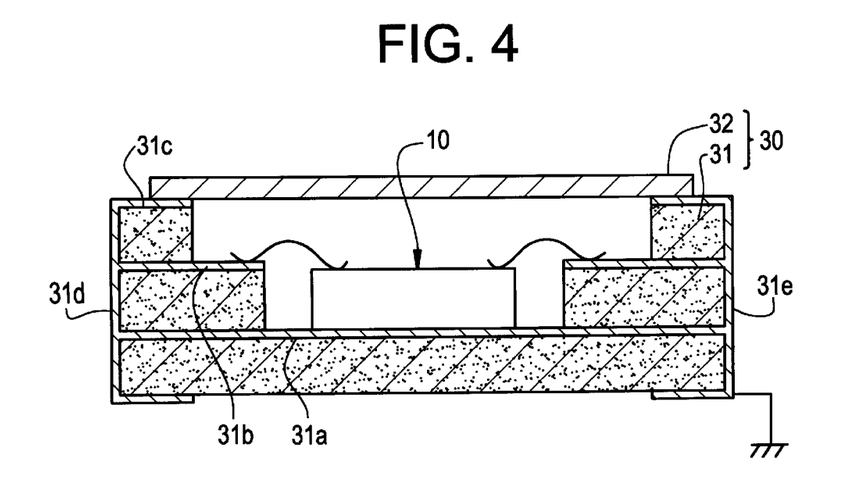
FIG. 4 is a cross section of the surface acoustic wave apparatus according to the first preferred embodiment of the present invention.
Figure 11:
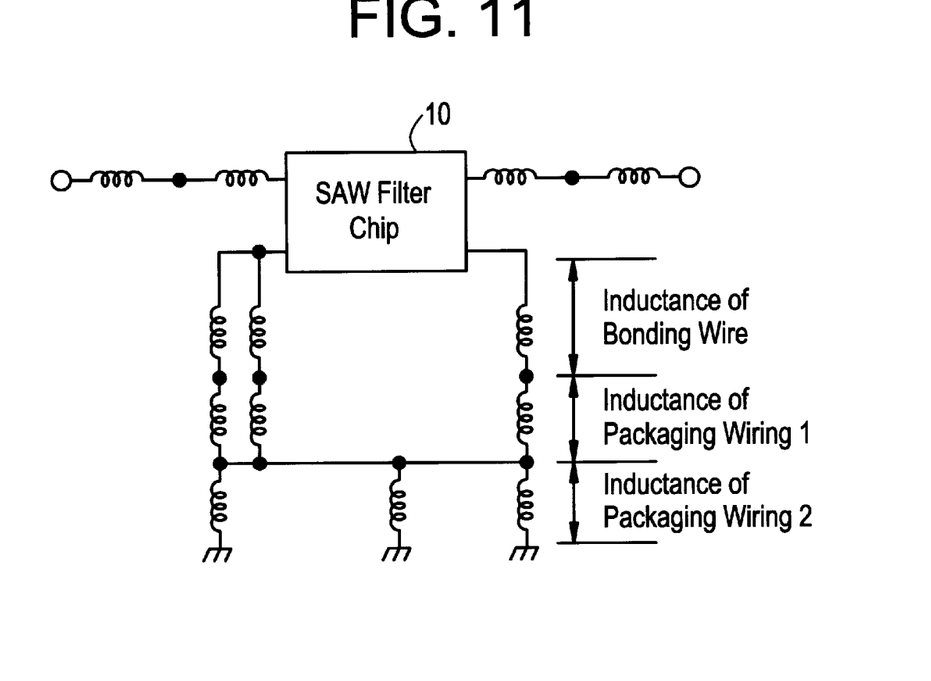
FIG. 11 is an equivalent circuit diagram of the surface acoustic wave apparatus according to the first preferred embodiment used for describing residual inductance formed of bonding wires and package wiring.

FIG. 3 is a typical plan view of a surface acoustic wave apparatus according to a first preferred embodiment of the present invention. An electrical connection structure of the apparatus will be described below. FIG. 4 is a longitudinal section view of the surface acoustic wave apparatus. FIG. 11 is a circuit diagram of the surface acoustic wave apparatus of FIG. 3.

In FIG. 3, the surface acoustic wave apparatus according to the present preferred embodiment includes first and second longitudinally-coupled resonator filters 11 and 12 having different pass-band characteristics.

The first and second longitudinally-coupled resonator filters 11 and 12 are configured by forming various electrodes, described later, on a surface-wave board 13. The resonator filters 11 and 12 and the surface-wave board 13 define a single SAW filter chip 10.

The surface-wave board 13 is preferably made from a piezoelectric material such as piezoelectric single crystal, including $LiTaO_3$, $LiNbO_3$, and quartz crystal, and piezoelectric ceramic, including lead-titanate-zirconate piezoelectric ceramic. The surface-wave board 13 may be an insulating board, such as alumina, on which the piezoelectric thin film, including ZnO, is disposed. In this case, various electrodes described later are formed such that they contact the piezoelectric thin film. In other words, the electrodes may be disposed on the piezoelectric thin film or between the piezoelectric thin film and the insulating board.

In this preferred embodiment, the first and second longitudinally-coupled resonator filters 11 and 12 are preferably formed such that the pass band of the first longitudinally-coupled resonator filter is 860 to 885 MHz and the pass band of the second longitudinally-coupled resonator filter is 810 to 828 MHz.

Various electrodes disposed on the surface-wave board 13 will be described next. An input electrode 14 is preferably disposed at a center portion of the SAW filter chip 10. The input electrode 14 is connected to the hot electrode of an IDT 16 disposed at the center portion of the first longitudinally-coupled resonator filter 11 through an impedance-matching IDT 15.

The ground electrode of the IDT 16 is connected to an ground-electrode land 16a. IDTs 17 and 18 are located on opposite sides of the IDT 16. Reflectors 19a and 19b are disposed at opposite sides of an area where IDTs 16 to 18 are located in the direction in which a surface acoustic wave propagates. The hot electrodes of IDTs 17 and 18 are electrically connected to each other with an electrode pattern located on the surface-wave board 13. An output-electrode land 20a is disposed at a certain position in the electrode pattern on the surface-wave board 13.

The hot electrodes of IDTs 17 and 18 are electrically connected to ground-electrode lands 20b and 20c, respectively.

As shown in FIG. 3, in the first longitudinally-coupled resonator filter 11, the ground electrode of the center IDT 16 and the ground-electrode land 16a are enclosed by the electrode pattern 20d which connects the hot electrodes of IDTs 17 and 18 in common.

The second longitudinally-coupled resonator filter 12 is electrically connected to the input electrode 14 through impedance-matching resonators 21 and 22. In the longitudinally-coupled resonator filter 12, a center IDT 23 serves as an output IDT, and IDTs 24 and 25 disposed at opposite sides of the IDT 23 serve as input IDTs. Reflectors 26a and 26b are disposed at opposite sides of IDTs 23 to 25 in the direction in which a surface acoustic wave propagates.

The hot electrode of IDT 23 is electrically connected to an output-electrode land 27a located on the surface-wave board. An electrode connected to the ground of IDT 23 is connected to a ground-electrode land 27b. The ground electrodes of IDTs 24 and 25 disposed at both sides of IDT 23 are connected in common to a ground-electrode land 27c disposed on the surface-wave board 13. In this case, the output-electrode land 27a is enclosed by an electrode pattern 27d which connects the ground electrodes of IDTs 24 and 25 in common.

The hot electrodes of IDTs 24 and 25 are connected in common and further connected to the input electrode 14 described above. At the output side of the longitudinally-coupled resonator filter 12, the ground-electrode land 27b is enclosed by an electrode pattern 27e connected to the hot electrode of IDTs 24 and 25.

As described above, the various electrodes are disposed on the surface acoustic board 13, and the SAW filter chip 10 includes a two-stage resonator filter having the input electrode 14 and the output-electrode lands 20a and 27a.

In the surface acoustic wave filter apparatus according to the present preferred embodiment, the SAW filter chip 10 is accommodated into a package 30 as shown in FIG. 4. The package 30 includes a package member 31 including a multilayer board and a cover member 32 preferably made of a metal. The package member 31 is preferably formed by, for example, a ceramic lamination technology, and has electrodes 31a to 31c in its interior at a plurality of vertical levels. FIG. 4 indicates the vertical locations of electrodes 31a to 31c. Electrodes 31a to 31c have various patterns. Electrode 31a serves as a ground pattern and is connected to external electrodes 31d and 31e at both ends. Electrode 31b indicates ground electrodes among electrodes 33A to 33H shown in FIG. 3 and described later.

Referring to FIG. 3, an electrical connection structure preferably in the form of a bonding wire between the SAW filter chip 10 and the ground electrodes formed in the package 30 will be described. Electrodes 33A to 33H indicated at the sides of the SAW filter chip 10 in FIG. 3 are disposed on the same layer of the package member as indicated by electrode 31b in FIG. 4. Electrode 33B serves as an input electrode, electrodes 33F and 33H serve as output electrodes, and the other electrodes 33A, 33C, 33D, 33E, and 33G serve as ground electrodes.

The input electrode 14 of the surface acoustic wave filter chip 10 is electrically connected to an input electrode 33B disposed in the package member, by bonding wire 34a. An output electrode 33F of the package member is connected to an output-electrode land 20a by bonding wire 34b. An output electrode 33H is electrically connected to an output-electrode land 27a of the second longitudinally-coupled resonator filter 12 by bonding wire 34c.

The ground electrode of IDT 17, which is one of the IDTs adjacent to the reflectors of the first longitudinally-coupled resonator filter 11, is connected to a ground-electrode land 20b. A ground-electrode land 20b is electrically connected to ground electrodes 33A and 33G by two bonding wires 34d and 34e. A ground-electrode land 20c connected to the ground electrode of IDT 18 is connected to a ground electrode 33G by bonding wire 34f.

In other words, the ground electrodes of IDTs 17 and 18 are connected to ground electrodes 33A and 33G formed in the package, by bonding wires 34d, 34e, and 34f. At least two bonding wires, 34d and 34e, are connected to different ground electrodes 33A and 33G. A third bonding wire 34f is connected between a ground-electrode land 20c and a ground electrode 33G.

A ground-electrode land 16a connected to the hot electrode of the center IDT 16 is connected to a ground electrode 33E by bonding wire 34j.

Ground electrodes 33A and 33G are electrically connected through ground patterns disposed in different layers of the package.

In the second longitudinally-coupled resonator filter 12, electrodes connected to the ground of IDTs 24 and 25 adjacent to the reflectors are connected to a ground-electrode land 27c. A ground-electrode land 27c is electrically connected to ground electrodes 33C and 33D with bonding wires 34g and 34h. In other words, at least two bonding wires 34g and 34h are connected to different ground electrodes 33C and 33D. A fourth bonding wire 34i is connected between a ground-electrode land 27b and a ground electrode 33C.

Figure 5:
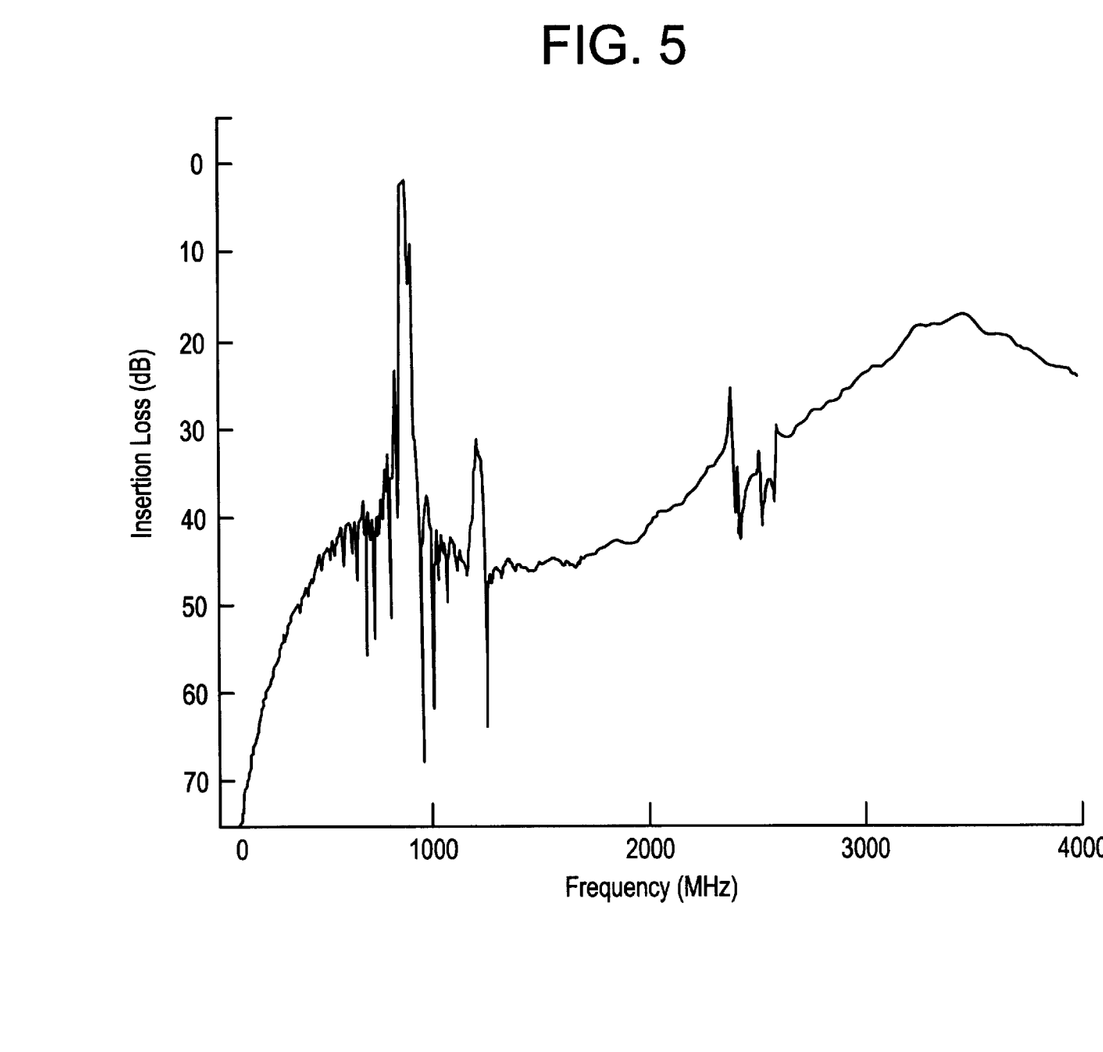
FIG. 5 shows the frequency-amplitude characteristics of a first longitudinally-coupled resonator filter in the surface acoustic wave apparatus according to the first preferred embodiment.
Figure 6:
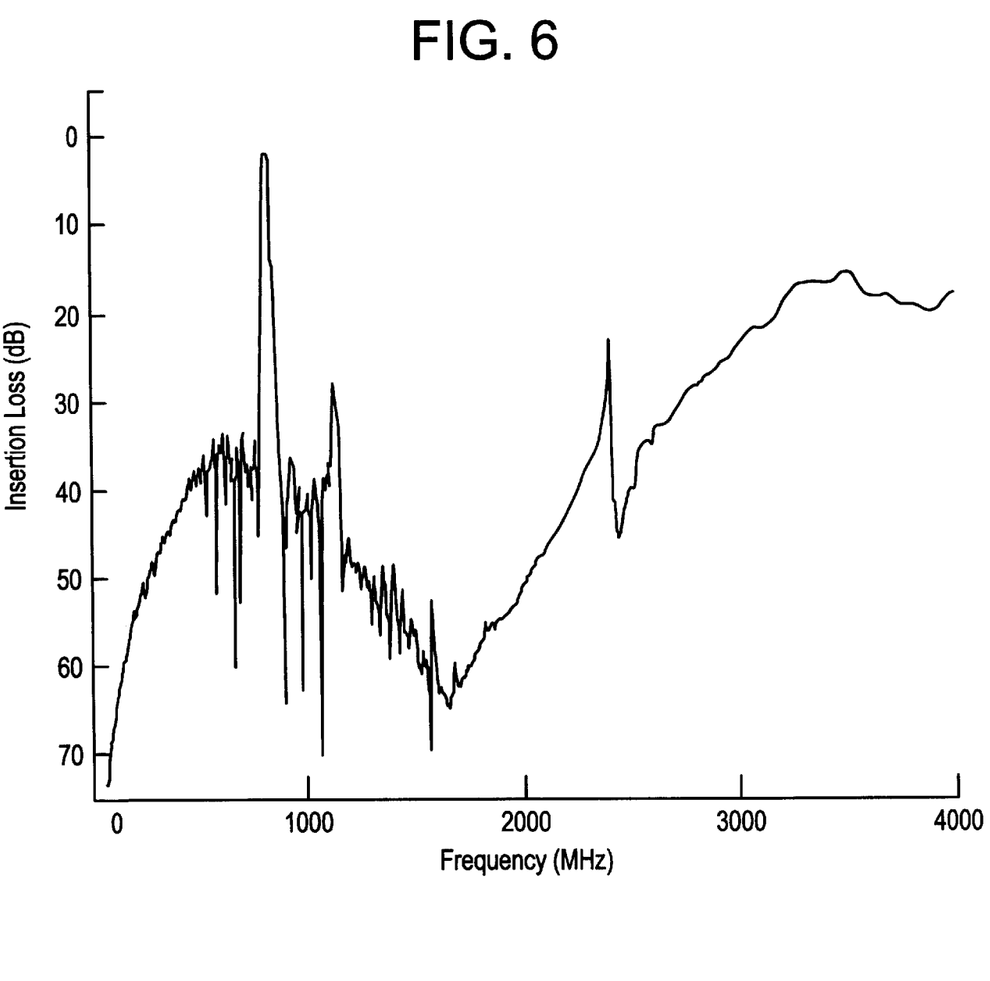
FIG. 6 shows the frequency-amplitude characteristics of a second longitudinally-coupled resonator filter in the surface acoustic wave apparatus according to the first preferred embodiment.

FIG. 5 shows the frequency-amplitude characteristics of the first longitudinally-coupled resonator filter 11 at the inside and outside of the pass band in the surface acoustic wave filter apparatus according to the present preferred embodiment shown in FIGS. 3 and 4. FIG. 6 shows the frequency-amplitude characteristics of the second longitudinally-coupled resonator filter 12 at the inside and outside of the pass band.

Figure 7:
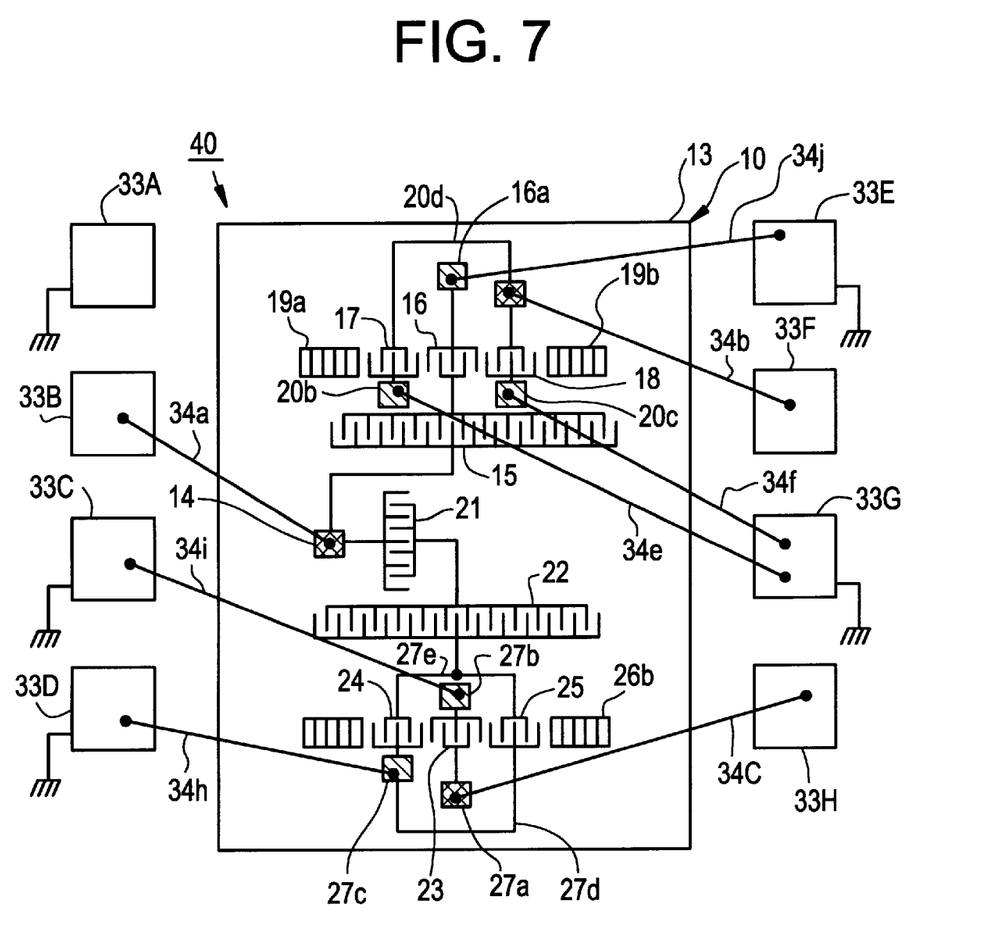
FIG. 7 is a rough plan view of a surface acoustic wave apparatus prepared for comparison.
Figure 8:
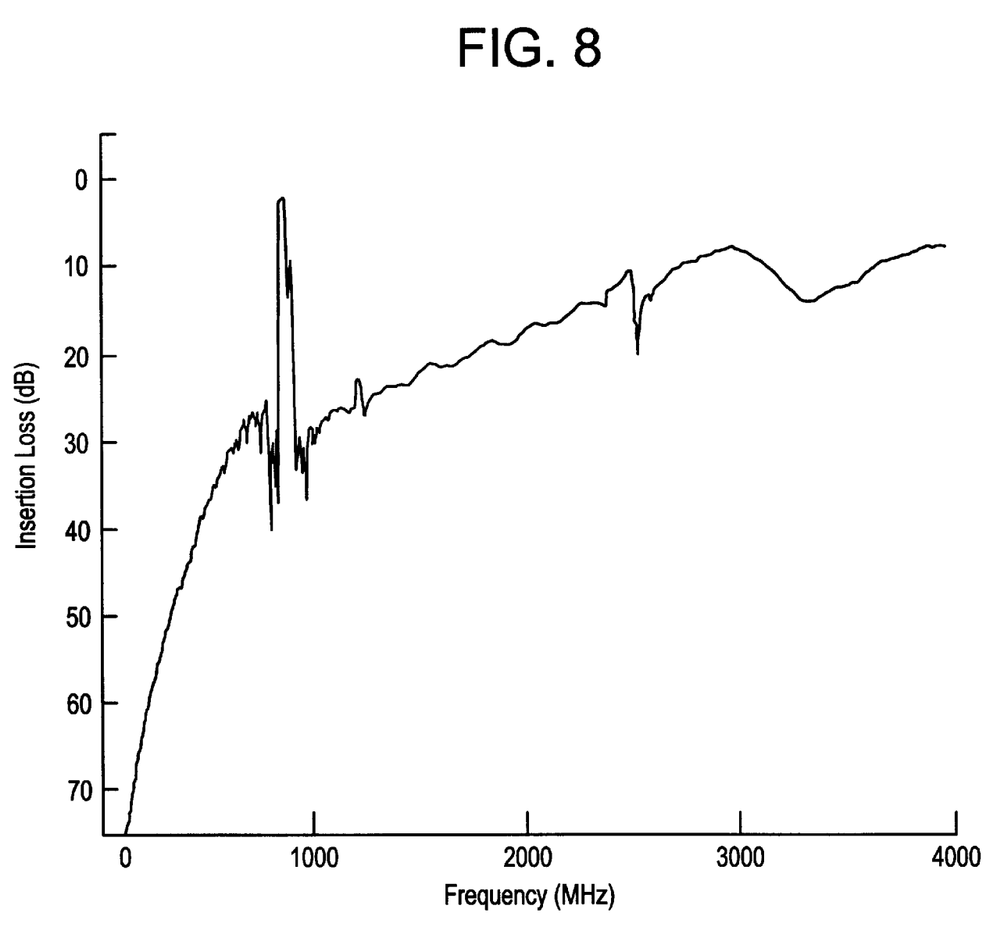
FIG. 8 shows the frequency-amplitude characteristics of a first longitudinally-coupled resonator filter in the surface acoustic wave apparatus prepared for comparison.
Figure 9:
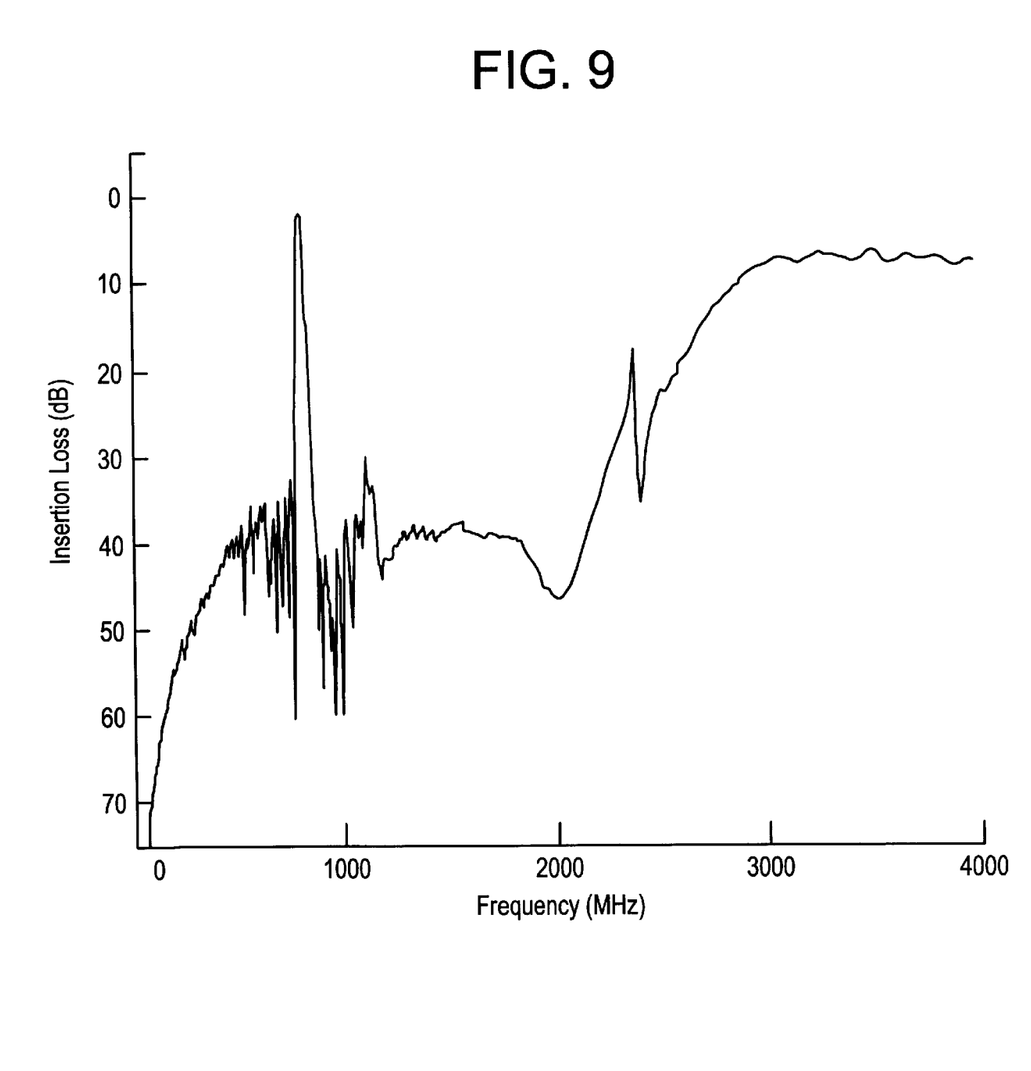
FIG. 9 shows the frequency-amplitude characteristics of a second longitudinally-coupled resonator filter in the surface acoustic wave apparatus prepared for comparison.

For comparison, FIGS. 8 and 9 show the frequency-amplitude characteristics of first and second longitudinally-coupled resonator filters shown in FIG. 7, which constitute a surface acoustic wave filter apparatus.

The surface acoustic wave filter apparatus 40 shown in FIG. 7 is the same as that shown in FIG. 3 except that neither bonding wire 34d nor bonding wire 34g, both shown in FIG. 3, is used. Therefore, the same reference numerals are assigned to the same portions and the descriptions thereof will be omitted.

Therefore, the surface acoustic wave filter apparatus 40 shown in FIG. 7 is the same as that described in the above preferred embodiment except that the ground electrodes of both-side IDTs adjacent to the reflectors in the first and second longitudinally-coupled resonator filters are not connected to different ground electrodes of the package.

It is clear from comparison between the characteristics shown in FIGS. 5 and 6 and those shown in FIGS. 8 and 9 that the surface acoustic wave filter apparatus of the present preferred embodiment has larger attenuation at the outside of the pass band, especially at the higher-frequency side, for both the first and second longitudinally-coupled resonator filters than the surface acoustic wave filter apparatus shown in FIG. 7.

Figure 10:
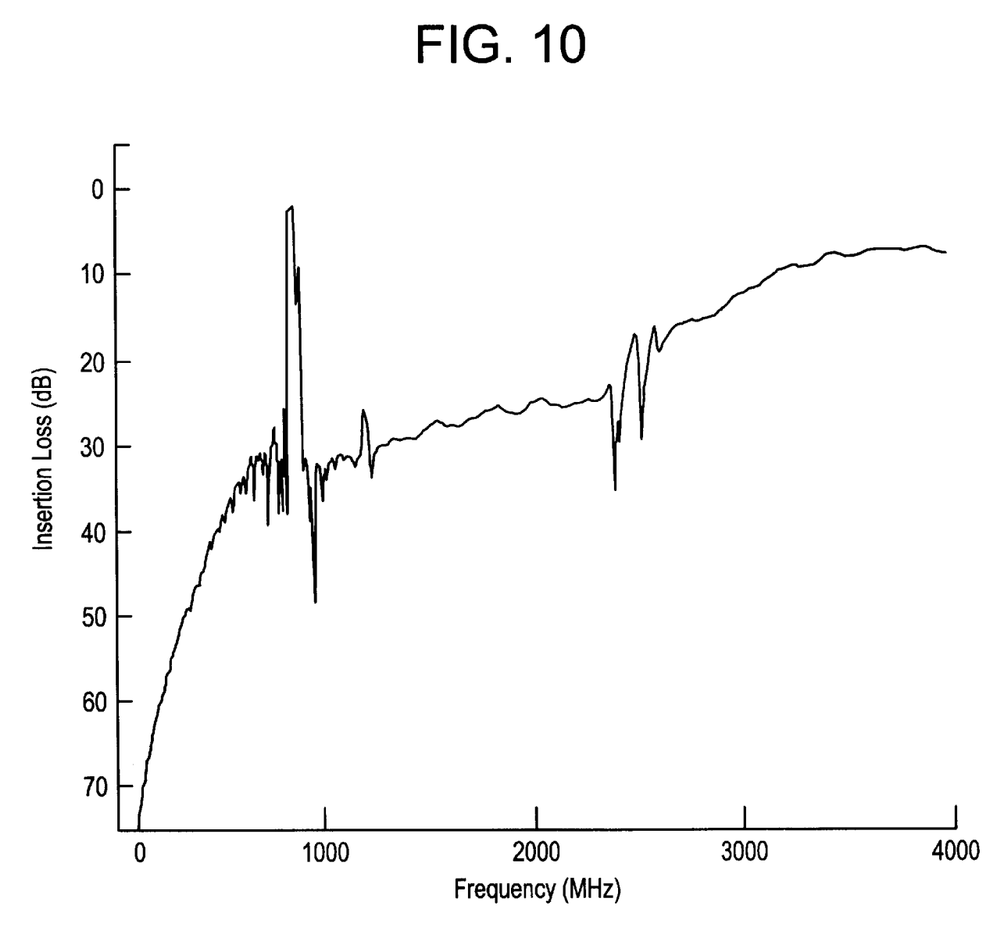
FIG. 10 shows the frequency-amplitude characteristics of a longitudinally-coupled resonator filter in a conventional surface acoustic wave apparatus.

FIG. 10 shows frequency-amplitude characteristics in a case in which ground terminals are independently connected to different ground electrodes formed in a package member at the input and output sides of a longitudinally-coupled resonator filter as described in Japanese Unexamined Patent Publication No. 4-263509. To facilitate comparison, the same filter as the first longitudinally-coupled resonator filter 11 shown in FIG. 3 except for connection with bonding wire at the ground electrodes was made to obtain the characteristics shown in FIG. 10.

It is clearly understood from comparison between the frequency-amplitude characteristics shown in FIG. 10 and those shown in FIGS. 5 and 8 that the characteristics shown in FIG. 10 indicate larger attenuation outside the pass band than the frequency-amplitude characteristics of the comparison example shown in FIG. 8, but the frequency-amplitude characteristics shown in FIG. 5 has further larger attenuation at the outside of the pass band, especially at the higher-frequency side.

The surface acoustic wave filter apparatus of the present preferred embodiment has a large attenuation outside the pass band as described above because a residual inductance created at portions extending from the ground terminals of the longitudinally-coupled resonator filter to the ground electrodes at the package side and a residual inductance created at a ground pattern extending from the inside of the package to an external terminal are significantly reduced, and a decrease in attenuation at the higher frequency side of the pass band is prevented due to enhancement of the ground paths.

Since the ground electrodes of the center IDTs 16 and 23 of the first and second longitudinally-coupled resonator filters 11 and 12 are enclosed by the electrode patterns 20d and 27e connecting in common the hot electrodes of IDTs 17 and 18 and IDTs 24 and 25 in the surface acoustic wave filter apparatus of the present preferred embodiment, parasitic capacitances are generated therebetween. It is preferred that these parasitic capacitances be small. It is preferred that the sides opposing the hot electrodes, of the ground electrodes of IDTs 16 and 23 be small. In contrast, the ground electrodes of outer IDTs 17 and 18 and IDTs 24 and 25 can have larger electrode areas without increasing their respective sides opposing the hot electrodes. Therefore, an increase in the above parasitic capacitances is small.

To increase the number of bonding wires connected to one electrode, the area of the electrode needs to be increased. It is preferred that the number of bonding wires be increased at the ground electrodes of outer IDTs in order to suppress an increase of parasitic capacitance. Therefore, in the present preferred embodiment, since the number of bonding wires connected to the ground electrodes of outer IDTs 17, 18, 24, and 25 is increased as described above, an increase of the parasitic capacitance can be effectively suppressed.

Figure 12:
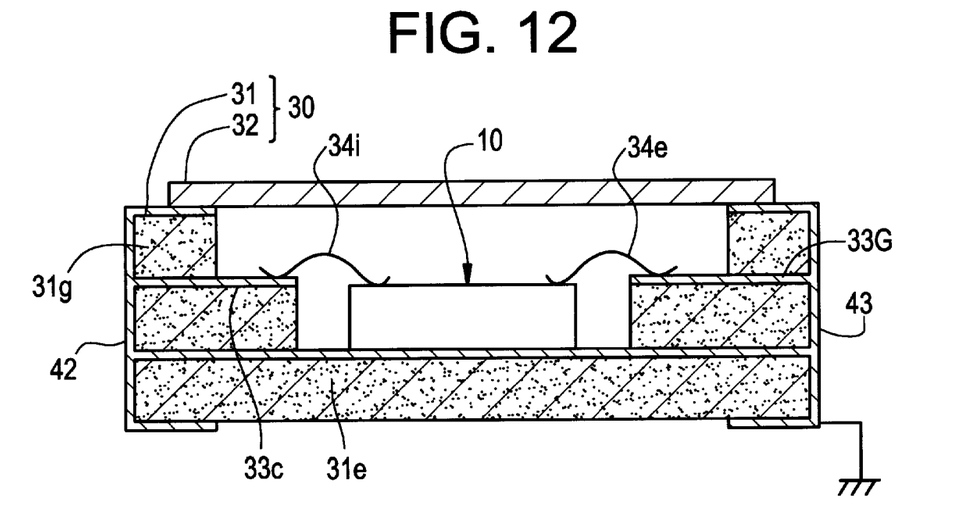
FIG. 12 is a cross section view of a surface acoustic wave apparatus according to a second preferred embodiment of the present invention.
Figure 13:
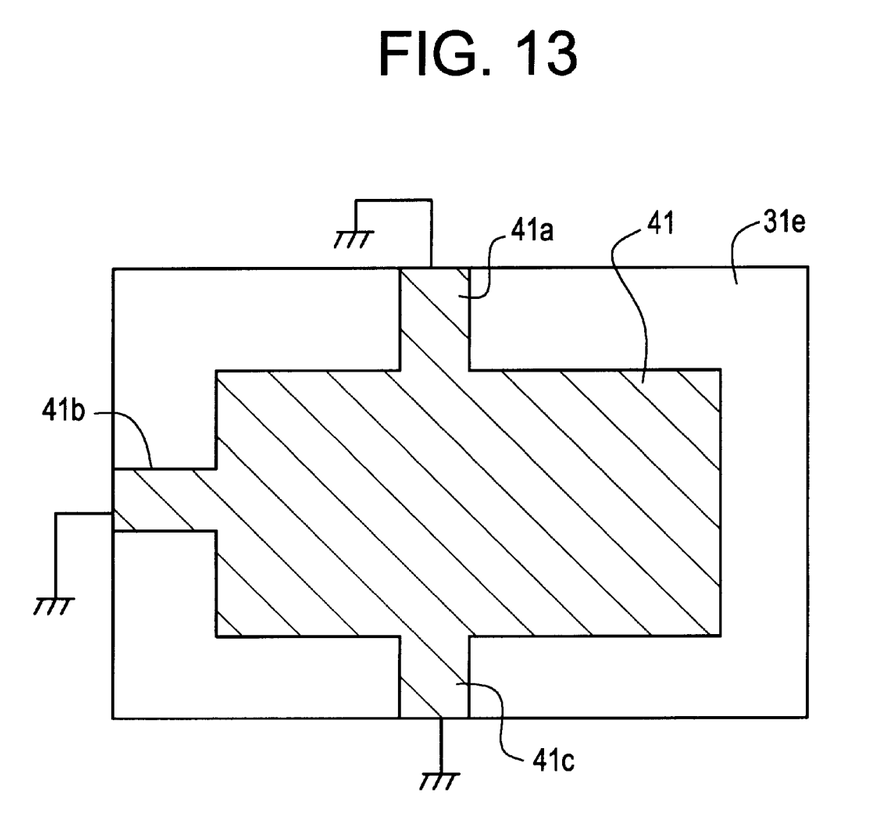
FIG. 13 is a rough plan view in section of the surface acoustic wave apparatus according to the second preferred embodiment of the present invention.

FIGS. 12 and 13 are a cross section view and a partially broken plan view in section used for describing a surface acoustic wave apparatus according to a second preferred embodiment of the present invention.

The surface acoustic wave apparatus of the present preferred embodiment is configured similar to the surface acoustic wave apparatus of the first preferred embodiment except for the ground patterns provided in the package.

In other words, as shown in FIG. 12, the SAW filter chip 10 described in the first preferred embodiment is accommodated into a package 30. The SAW filter chip 10 is secured on a ground pattern 41 formed on a ceramic layer 31*e* of a package member 31. The ground pattern 41 is formed on the upper surface of the ceramic layer 31*e* such that it has an almost rectangular shape smaller in area than the ceramic layer 31*e*, as shown in FIG. 13. The ground pattern 41 extends to peripheral edges of the ceramic layer 31*e* via lead sections 41*a* to 41*c*. In FIG. 13, the lead sections 41*a* to 41*c* separately extend to three sides of the ceramic layer 31*e*. On the other hand, external electrodes 42 and 43 are disposed at sides of the package member 31 such that they are electrically connected to ground electrodes 33C and 33G described before and also electrically connected to the ground pattern 41. The external electrodes 42 and 43 are joined to the cover member 32 preferably made of a metal, at the upper surface of a ceramic layer 31*g*.

Although not shown in the figure, the other ground electrodes 33A, 33D, and 33E, shown in FIG. 3, are electrically connected to the external electrodes 42 and 43 in the same way as for ground electrodes 33C and 33G.

Figure 14:
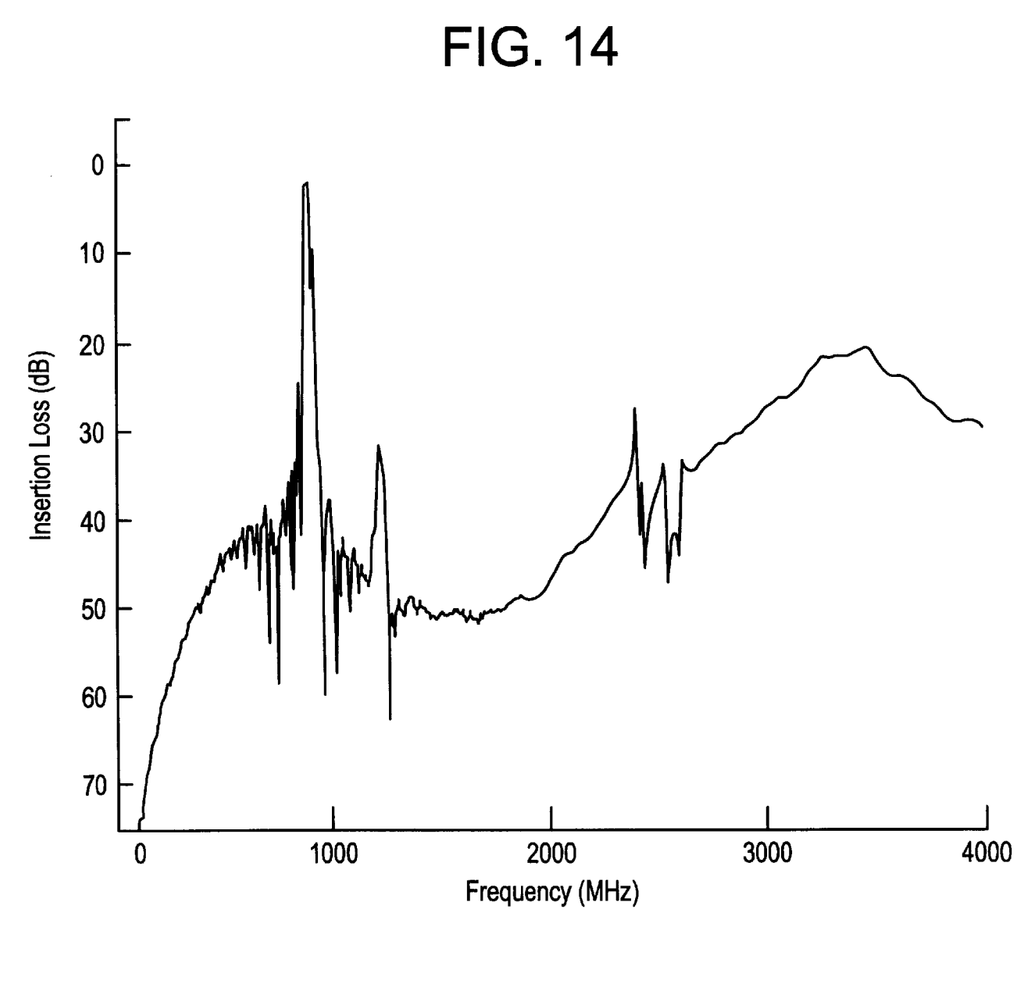
FIG. 14 shows the frequency-amplitude characteristics of a first longitudinally-coupled resonator filter in the surface acoustic wave apparatus according to the second preferred embodiment of the present invention.

Therefore, in the surface acoustic wave apparatus according to the second preferred embodiment, the ground pattern 41, which is electrically joined to the cover member 32 made from a metal, is formed of internal wiring of the package member 31 made from ceramic, and is led out at three portions as described above, a sufficient case ground is obtained. FIG. 14 shows the frequency-amplitude characteristics of the first longitudinally-coupled resonator filter in the surface acoustic wave apparatus of the present preferred embodiment. It is clear from comparison between the characteristics shown in FIG. 14 and that shown in FIG. 5, in which case grounding is obtained at two portions, that attenuation can further be increased at the higher frequency side of the pass band.

The pass band of the first SAW resonator filter of the present preferred embodiment is 860 to 885 MHz.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A surface acoustic wave apparatus comprising:
a resonator filter chip including a surface-wave board, at least three interdigital transducers disposed on said surface-wave board and each of the interdigital transducers including a ground electrode, and a pair of reflectors disposed at opposite sides of an area where said three interdigital transducers are located;
a multilayer package having a plurality of electrodes arranged such that the resonator filter chip is accommodated in the multilayer package; wherein
the ground electrode of at least one of the interdigital transducers located adjacent to said reflectors is connected to at least two different ground electrodes which are located on a common layer of said package.

2. A surface acoustic wave apparatus according to claim 1, wherein the ground electrode of each of the two interdigital transducers located adjacent to said reflectors is connected to at least two different ground electrodes which are located on a common layer of said package.

3. A surface acoustic wave apparatus according to claim 1, further comprising at least two bonding wires, wherein the ground electrode of said at least one of the interdigital transducers located adjacent to said reflectors is connected to the at least two different ground electrodes via the at least two bonding wires.

4. A surface acoustic wave apparatus according to claim 3, wherein the at least two bonding wires are connected to a ground electrode of a common one of the interdigital transducers located adjacent to said reflectors.

5. A surface acoustic wave apparatus according claim 3, further comprising a third bonding wire connected to the ground electrode of one of said interdigital transducers located adjacent to said reflectors, wherein one bonding wire of said at least two bonding wires is connected to a ground electrode of said package to which said third bonding wire is connected.

6. A surface acoustic wave apparatus according to claim 3, further comprising another bonding wire connected to the ground electrode of a center interdigital transducer, wherein one bonding wire of said at least two bonding wires is electrically connected to a ground electrode of said package to which said another bonding wire is connected.

7. A surface acoustic wave apparatus according to claim 1, further comprising two longitudinally-coupled resonator filters disposed on said surface wave board and having different pass-band characteristics.

8. A surface acoustic wave apparatus according to claim 7, wherein inputs or outputs of said two longitudinally-coupled resonator filters are connected in parallel, and said ground electrode of each of said interdigital transducers is connected to another ground electrode located on a common layer of said package.

9. A surface acoustic wave apparatus according to claim 1, wherein a ground electrode located in said package is electrically connected to at least three external electrodes disposed on a surface of said package.

10. A surface acoustic wave apparatus comprising:
a resonator filter chip including at least two longitudinally-coupled resonators and a surface-wave board on which the at least two longitudinally-coupled resonators are disposed, the at least two longitudinally-coupled resonators being electrically coupled to each other, each of the at least two longitudinally-coupled resonators including at least three interdigital transducers disposed on said surface-wave board and a pair of reflectors disposed at opposite sides of an area where said three interdigital transducers are located, each of the interdigital transducers including a ground electrode;
a multilayer package having a plurality of electrodes arranged such that the resonator filter chip is accommodated in the multilayer package; wherein
the ground electrode of at least one of the interdigital transducers located adjacent to said reflectors in one of the at least two resonators is connected to at least two different ground electrodes which are located on a common layer of said package.

11. A surface acoustic wave apparatus according to claim 10, wherein the ground electrode of at least one of the interdigital transducers located adjacent to said reflectors in each of the at least two resonators is connected to at least two different ground electrodes which are located on a common layer of said package.

12. A surface acoustic wave apparatus according to claim 10, wherein the ground electrodes of each of the interdigital transducers located adjacent to said reflectors in each of the at least two resonators is connected to at least two different ground electrodes which are located on a common layer of said package.

13. A surface acoustic wave apparatus according to claim 10, further comprising at least two bonding wires, wherein the ground electrode of said at least one of the interdigital transducers located adjacent to said reflectors in said one of the at least two resonators is connected to the at least two different ground electrodes via the at least two bonding wires.

14. A surface acoustic wave apparatus according to claim 13, wherein the at least two bonding wires are connected to a ground electrode of a common one of the interdigital transducers located adjacent to said reflectors in said one of the at least two resonators.

15. A surface acoustic wave apparatus according claim 13, further comprising a third bonding wire connected to the ground electrode of one of said interdigital transducers located adjacent to said reflectors of said one of the at least two resonators, wherein one bonding wire of said at least two bonding wires is connected to a ground electrode of said package to which said third bonding wire is connected.

16. A surface acoustic wave apparatus according claim 13, further comprising another bonding wire connected to the ground electrode of a center interdigital transducer in one of the at least two resonators, wherein one bonding wire of said at least two bonding wires is electrically connected to a ground electrode of said package to which said another bonding wire is connected.

17. A surface acoustic wave apparatus according to claim 10, wherein the at least two longitudinally-coupled resonator filters have different pass-band characteristics.

18. A surface acoustic wave apparatus according to claim 17, wherein inputs or outputs of said at least two longitudinally-coupled resonator filters are connected in parallel, and said ground electrode of each of said interdigital transducers is connected to another ground electrode located on a common layer of said package.

19. A surface acoustic wave apparatus according to claim 10, wherein a ground electrode located in said package is electrically connected to at least three external electrodes disposed on a surface of said package.

20. A surface acoustic wave apparatus comprising:

a resonator filter chip including a surface-wave board, at least three interdigital transducers disposed on said surface-wave board and each of the interdigital transducers including a ground electrode, and a pair of reflectors disposed at opposite sides of an area where said three interdigital transducers are located;

a multilayer package having a plurality of electrodes arranged such that the resonator filter chip is accommodated in the multilayer package; wherein at least one of the ground electrodes of the interdigital transducers located adjacent to said reflectors is connected to at least two different ground electrodes which are located on a layer of said package.

* * * * *